United States Patent
Kunc et al.

(10) Patent No.: US 10,623,218 B2
(45) Date of Patent: Apr. 14, 2020

(54) DEMODULATOR CIRCUIT AND METHOD FOR DEMODULATION

(71) Applicant: STMicroelectronics International N.V., Schiphol (NL)

(72) Inventors: Vinko Kunc, Ljubljana (SI); Albin Pevec, Ljubljana (SI); Kosta Kovacic, Orehova Vas (SI)

(73) Assignee: STMicroelectronics International N.V., Schiphol (NL)

(*) Notice: Subject to any disclaimer, the term of this patent is extended or adjusted under 35 U.S.C. 154(b) by 65 days.

(21) Appl. No.: 15/580,843

(22) PCT Filed: Jun. 9, 2016

(86) PCT No.: PCT/EP2016/063178
§ 371 (c)(1),
(2) Date: Dec. 8, 2017

(87) PCT Pub. No.: WO2016/202679
PCT Pub. Date: Dec. 22, 2016

(65) Prior Publication Data
US 2018/0343152 A1    Nov. 29, 2018

(30) Foreign Application Priority Data
Jun. 15, 2015  (EP) .................................. 15172127

(51) Int. Cl.
*H03D 1/02*  (2006.01)
*H03D 1/22*  (2006.01)
(Continued)

(52) U.S. Cl.
CPC ............... *H04L 27/06* (2013.01); *H03D 1/02* (2013.01); *H03D 1/18* (2013.01); *H03D 1/22* (2013.01);
(Continued)

(58) Field of Classification Search
CPC .. H03D 1/00; H03D 1/02; H03D 1/18; H03D 1/22; H04B 5/0062; H04L 27/06; H04L 27/261
(Continued)

(56) References Cited

U.S. PATENT DOCUMENTS 6,360,090 B1 * 3/2002 Holcombe ........... H04B 10/114
                                                      348/189
7,054,389 B2 * 5/2006 Yokogawa ......... H04B 10/6933
                                                      375/340
(Continued)

FOREIGN PATENT DOCUMENTS

CN    102545949 A    7/2012
CN    102567767 A    7/2012
(Continued)

OTHER PUBLICATIONS

PCT Search Report and Written Opinion for PCT/EP2016/063178 dated Sep. 7, 2016 (11 pages).
(Continued)

*Primary Examiner* — Levi Gannon
(74) *Attorney, Agent, or Firm* — Crowe & Dunlevy

(57) ABSTRACT

A demodulator circuit receives an envelope signal for comparison against a switched reference signal that is generated as a function of the envelope signal and as a function of an output signal of the demodulator circuit. The switched reference signal is filtered by an RC filter prior to comparison. The output signal is dependent on a difference between the filtered switched reference signal and the envelope signal.

24 Claims, 6 Drawing Sheets

(51) Int. Cl.
*H04L 27/06* (2006.01)
*H03D 1/18* (2006.01)
*H04L 27/26* (2006.01)
*H04B 5/00* (2006.01)

(52) U.S. Cl.
CPC .......... *H04L 27/261* (2013.01); *H04B 5/0062* (2013.01)

(58) Field of Classification Search
USPC ......................................................... 329/347
See application file for complete search history.

(56) References Cited

U.S. PATENT DOCUMENTS

| | | | |
|---|---|---|---|
| 8,446,983 B2 | 5/2013 | Wang et al. | |
| 2002/0098818 A1 | 7/2002 | Yokogawa et al. | |
| 2005/0104572 A1 | 5/2005 | Smith et al. | |
| 2006/0158243 A1* | 7/2006 | Conraux | G06K 19/0723 329/347 |
| 2006/0238301 A1 | 10/2006 | Wu et al. | |
| 2007/0126584 A1* | 6/2007 | Hyde | H04B 5/0062 340/572.4 |
| 2008/0252367 A1* | 10/2008 | Pettersen | H04L 27/06 329/311 |
| 2010/0158157 A1* | 6/2010 | Iwata | H04L 27/06 375/320 |
| 2010/0215122 A1* | 8/2010 | Nihei | H03K 5/082 375/316 |
| 2014/0118061 A1 | 5/2014 | Chung et al. | |

FOREIGN PATENT DOCUMENTS

| | | |
|---|---|---|
| CN | 102810180 A | 12/2012 |
| CN | 103795346 A | 5/2014 |
| CN | 104156760 A | 11/2014 |
| CN | 104200260 A | 12/2014 |
| CN | 204442289 U | 7/2015 |

OTHER PUBLICATIONS

EPO Search Report and Written Opinion for EP15172127.1 dated Nov. 27, 2015 (8 pages).
First Office Action and Search Report for Co-Pending CN Appl. No. 201580032089.7 dated Jan. 21, 2020 (9 pages).

* cited by examiner

DEMODULATOR CIRCUIT AND METHOD FOR DEMODULATION

CROSS REFERENCE TO RELATED APPLICATIONS

This application is 371 filing from PCT/EP2016/063178 filed Jun. 9, 2016, which claims priority to European Application for Patent No. 15172127.1 filed Jun. 15, 2015, the disclosures of which are incorporated by reference.

TECHNICAL FIELD

The field of this application is Radiofrequency Identification (RFID) technology. Especially, the application is directed to a demodulator circuit and a method for demodulation, in particular, the demodulation of amplitude shift keying (ASK) modulated signals.

The specified circuit and method can be used in passive transponder demodulators, active transponder demodulators and in near-field communication (NFC) devices which support peer-to-peer (P2P) communication mode and/or card emulation mode.

BACKGROUND

ASK is a digital form of amplitude modulation (AM). The modulation used in this application is ASK, however, the terms AM and ASK are used interchangeably.

In high-frequency (HF) RFID/NFC systems signaling from interrogator/reader to tag or P2P, initiator to target, is affected by amplitude modulation of a carrier signal by the reader. In the case of ISO 14443B, FeliCa and ISO 15693, the AM index used is between 8% and 30%. The limits are tighter in some of the protocols. In the case of ISO 14443A with a data rate of 106 kbps, the amplitude modulation is 100% with up to 5% residuum signal allowed, which corresponds to so-called On-Off Keying (OOK) in effect.

The modulation index is an indicator of the level of modulation on an amplitude modulated signal. It is a measure of extent of the amplitude variation about an unmodulated carrier signal. The modulation index is defined according to RFID standards relevant for the present application, e.g. the NFCIP-1 standard, as the quotient of the difference between the peak and the minimum signal amplitude and the sum of the peak and the minimum signal amplitude. This is expressed in the following formula for the modulation index:

$$\frac{(a-b)}{(a+b)}$$

Therein a represents the peak amplitude and b represents the minimum amplitude of the modulated signal, respectively.

The modulation index is possibly expressed as a percentage. A modulation index of, for example, 8% can be expressed as a modulation depth of 14.8%.

Besides this basic difference in amplitude modulation index, the ISO specified protocols also differ greatly in the data signaling structure.

ISO 14443A and NFC forum NFC-A technology are based on OOK modulation using modified miller pulse position coding. FIG. 1 shows a modulated carrier signal with start of frame (SOF), data and end of frame (EOF), according to ISO 14443A. FIG. 2 depicts the corresponding envelope signal. The carrier itself cannot be discerned due to its high frequency. It can be seen that the SOF symbol heading the communication is composed of one pulse only. The EOF is marked by a non-modulated period.

ISO 14443B and NFC forum NFC-B technology employ direct bit coding. FIG. 3 depicts an accordingly modulated carrier signal and FIG. 4 the corresponding envelope signal. The SOF symbol is composed of ten to eleven low bits followed by two to three high bits. The EOF is represented by some low bits.

FeliCa protocol, also called NFC-F technology, is quite different. The data is Manchester coded on a sub-carrier clock of 212 KHz or 424 KHz. The SOF has a train of 48 or more unmodulated sub-carrier clocks. Beginning of data is marked by a first change in phase of the sub-carrier. EOF is signaled by the data. FIG. 5 shows the resultant modulated carrier signal and FIG. 6 the corresponding envelope signal.

Due to the use of OOK and ASK, two types of demodulators are typically employed: an OOK demodulator and an ASK demodulator. The ASK demodulator must operate on a span of allowed modulation indexes, e.g. 8-30% in case of FeliCa and 8-14% in case of ISO 14443B. In case of ISO 14443B, the demodulator must detect even the first amplitude change with sufficiently small timing distortion due to the structure of the SOF. On the other hand, the FeliCa signaling allows the demodulator to use the starting clock signals to perform settling of the demodulator. Therefore, the timing distortion on starting clocks can be higher than allowed but is reduced below the allowed level after a few clocks, e.g. ten. The time distortion or pulse width (PW) distortion introduced by the demodulator that can be tolerated by a subsequent digital signal processing is quite different for ISO 14443B and FeliCa. The timing distortion of the demodulator is mainly caused by the non-ideal, i.e. sloped AM signal shapes. Looking at the ratio of allowed slopes of AM signals as a percentage of bit duration in the case of ISO 14443B, the sloping can take up to two times 16 carrier cycles which amounts to approximately 3.6 µs out of 9.44 µs a bit duration which accounts for roughly 25% of bit duration. FeliCa 212 allows a maximum slope of 2 times 2 µs out of 4.8 µs bit duration which makes up approximately 80% of bit duration.

The requirement for ISO 14443B demodulation is to receive each, i.e. even the first AM modulation transition correctly and with low enough PW distortion. The requirement on PW distortion, however, is not as strict as for the FeliCa protocol.

The requirements for the FeliCa protocol are very strict on PW distortion, but the demodulator can use a few starting AM modulated clock pulses as a means to settle the demodulator. This settling is needed as the incoming envelope signal can differ greatly in the initial signal level, i.e. in the amplitude of the AM signal due to different AM modulation indexes used and in the sloping of AM envelope signal.

To meet those conflicting demands, two AM demodulators of different structure are usually employed in known solutions.

In a state of the art demodulator for ISO 14443B, the ASK modulated signal is rectified and filtered to generate the envelope signal. The demodulation operates on the principle of comparing the envelope signal with a reference signal, which is generated by low pass filtering the envelope signal. The time constant of the reference voltage generation is adjustable and can track the data rate. The comparison of the envelope and the reference signal is performed on a comparator which outputs the digitized demodulated signal. The output of the comparator also serves as the control for the comparator threshold voltage sign, which is added to the reference voltage to create a hysteresis. The threshold voltage magnitude is dependent on the offset of the comparator. The output of the comparator is connected to a noise remover circuit which rejects short pulses by delaying the output signal. Operation of a corresponding state of the art demodulator is shown in FIG. 7. Before the first modulation pulse, the reference signal settles to the same level as the envelope signal. The hysteresis is set such that the threshold voltage with hysteresis is below the envelope signal. When the comparator detects the crossing event, it inverts the hysteresis such that the threshold voltage is above the envelope signal. The reference voltage is filtered with a filter that has a predefined time constant. Unfortunately, the demodulator is unsuitable for ISO 14443A signals.

A state of the art demodulator for FeliCa typically uses AC-coupling of the signal to achieve the required settling of the demodulation. Such an AC-coupled ASK demodulator circuit is composed of an antenna, a rectifying diode acting as an envelope detector, a capacitor connected in series, an amplifier and a data slicer. The RF signal received by the antenna is first rectified by the diode and then passed through the capacitor. The capacitor cuts away the DC component and passes through only the AC component, acting as a differentiator for the envelope signal. The resulting differentiating signal is amplified and supplied to the data slicer, which uses a predetermined threshold and converts the analogue signal to data symbols "0" and "1". Corresponding signals are depicted in FIG. 8. The data slicer has a window comparator with an upper and a lower reference. When the differentiated signal crosses the lower reference signal with a falling edge, the digitized signal changes its level to high. As soon as the differentiated signal crosses the upper reference signal with a rising edge, it changes the level of the digital signal to low. When the lower reference value is crossed with a rising edge and the upper reference signal with a falling edge the digitized signal level does not change.

As the use of two demodulators leads to an increase in cost of the implementation, there is a need in the art to define a single demodulator circuit and corresponding method which satisfy the conflicting requirements of the different standards used in HF RFID as described above.

SUMMARY

The definitions as described above also apply to the description of the below embodiments unless stated otherwise.

In one embodiment, a demodulator circuit comprises an input for receiving an envelope signal, a unit for providing a switched reference signal at its output, a filter component and a comparator. The unit for providing a switched reference signal is coupled to the input. The switched reference signal is provided as a function of the envelope signal and as a function of an output signal of the demodulator circuit. The filter component is connected to the output of the unit for providing the switched reference signal. The filter component is prepared to provide a filtered switched reference signal as a function of the switched reference signal. The comparator has a first input which is coupled to the input of the demodulator circuit, a second input which is coupled to an output of the filter component and an output for providing the output signal which is depending on a difference between the filtered switched reference signal and the envelope signal.

The demodulator receives the envelope signal and therefrom generates the switched reference signal. Said switched reference signal is filtered to generate the filtered switched reference signal which represents a slow tracking reference to be used by the comparator. The comparison is done between the envelope signal and the filtered switched reference signal. The result of this comparison is reflected in the output signal which is also used in the generation of the switched reference signal.

Due to the generation of the switched reference signal which is subsequently filtered, the proposed demodulator circuit is enabled to realize the features of an AC-coupled demodulator and the features of a DC-coupled demodulator with dual time constants as described above in a single demodulator. Consequently, the proposed demodulator is able to demodulate ISO 14443A, ISO 14443B and FeliCa reader signals.

The comparator is also called a data slicer.

The envelope signal comprises a rectified amplitude shift keying (ASK) modulated analog signal.

The envelope signal is, for example, generated by a reader and is obtained in a transponder by rectifying the ASK modulated reader signal in a way known to a person skilled in the art.

The output signal comprises a digital baseband signal.

The output signal of the demodulator circuit subsequently can be supplied to a decoder to decode the data sent by a reader device.

In a development, the filter component comprises a low-pass filter having a first variable resistor and a capacitor. A connection node between the first variable resistor and the capacitor forms the output of the filter component.

The switched reference signal is low pass filtered to generate the filtered switched reference signal. The RC network of the filter component holds the value of the filtered switched reference signal which is compared to the envelope signal. By means of the variable resistor, the time constant of the filter can be adjusted, for example, with the data rate of the modulated signal reflected by the envelope signal.

In one embodiment, the unit for providing the switched reference signal comprises an up-converter block for providing an increased signal and a down-converter block for providing a decreased signal. The up-converter block is coupled to the input of the demodulator circuit and to the output of the unit via a first switch. The down-converter block is coupled to the input of the demodulator circuit and to the output of the unit via a second switch.

The increased signal is generated by the up-converter block and provided in a switched manner to the output of the unit. The decreased signal is generated by means of the down-converter block and provided in a switched manner to the output of the unit.

All signals cited in this application may comprise a voltage, for instance. Consequently, a level of any signal signifies a voltage level, for example.

In a development, the up-converter block comprises an amplifier with an adjustable amplification ratio. The down-converter block comprises an attenuator with an adjustable attenuation ratio.

The up-converter block amplifies the envelope signal to provide the increased signal. The down-converter block attenuates the envelope signal to provide the decreased signal.

In an exemplary implementation, the amplifier and attenuator are realized by operational amplifiers.

In an alternative embodiment, the unit for providing the switched reference signal comprises a resistive divider having a second, a third and a fourth resistor which are connected in series. The second resistor is connected to the input of the demodulator circuit. The fourth resistor is connected to a ground potential terminal. A decreased signal is tapped at a first connection point between the third and the fourth resistor and is provided to the output of the unit via a second switch. An increased signal is tapped at the input of the demodulator circuit and is provided to the output of the unit via a first switch. The envelope signal is tapped at a second connection point between the second and the third resistor. Each of the second, third and fourth resistors has an adjustable resistance.

The increased and the decreased signal are generated by means of the resistive divider. The adjustable resistances serve for adapting the level of increase or decrease of the respective signal with respect to the envelope signal.

In a development, the increased signal and the decreased signal are each provided as a function of the envelope signal. A level of the increased signal is higher than a level of the envelope signal by a first adjustable ratio. A level of the decreased signal is lower than the level of the envelope signal by a second adjustable ratio.

In the previously described alternative which uses an amplifier in the up-converter block and an attenuator in the down-converter block, the first adjustable ratio is realized in the form of the adjustable amplification ratio. The second adjustable ratio is realized by the adjustable attenuation ratio.

In the second alternative, which has the resistive divider, the first and the second adjustable ratios are realized by the ratio of resistance of the resistors in question.

In an example, the increased signal's level is 105% the level of the envelope signal and the decreased signal's level is 95% the level of the envelope signal. Preferably, first and second adjustable ratios are selected to comply with a minimum modulation index which needs to be supported or with the expected noise level.

In a development, the first switch is controlled by the output signal, whereas the second switch is controlled by the inverted output signal such that the switched reference signal comprises either the increased or the decreased signal.

As soon as the first switch is closed by means of the output signal, the second switch is opened and the increased signal is provided to the filter component and forms the basis for the comparison with the envelope signal. In case the first switch is opened following the control by the output signal, the second switch is closed and the decreased signal is provided to the filter component and subsequently forms the basis for the comparison with the envelope signal.

In particular, first and second switches are controlled by means of the output signal of the comparator in such a way that the decreased signal corresponding to the attenuated envelope signal is connected to the filter component in the unmodulated state in which the output of the comparator is at logic low, while the increased signal which corresponds to the amplified envelope signal is connected to the filter component in the modulated state in which the output of the comparator is at logic high.

The filter component realizes a slow transition of the filtered switched reference signal each time the switched reference signal switches from the increased signal to the decreased signal or vice versa.

In a development, the comparator has a built-in hysteresis.

The built-in hysteresis avoids glitches in the output signal. Therefore, in an example implementation, the output signal can be directly used to control the first and second switch.

In one embodiment, a method for demodulation comprises the following steps: providing an envelope signal, generating a switched reference signal as a function of the envelope signal and in dependence on an output signal, filtering the switched reference signal to provide a filtered switched reference signal, and comparing the filtered switched reference signal with the envelope signal and providing the output signal depending on the comparison.

As the threshold, i.e. the filtered switched reference signal, to which the envelope signal is compared can be switched between different levels depending on the outcome of the comparison, the proposed method is able to realize an AC-coupled demodulation, as well as a DC-coupled demodulation of the envelope signal.

The proposed method can be implemented by means of the described demodulator circuit, for example.

In a development the generation of the switched reference signal comprises: increasing a level of the envelope signal in order to provide an increased signal, decreasing a level of the envelope signal in order to provide a decreased signal, depending on a level of the output signal providing either the increased signal or the decreased signal as the switched reference signal.

In an alternative embodiment, the generating the switched reference signal comprises: using the envelope signal as an increased signal, decreasing a level of the envelope signal, further decreasing the level of the envelope signal in order to provide a decreased signal.

In both alternatives, depending on a level of the output signal, either the increased signal or the decreased signal is provided as the switched reference signal.

In a further embodiment, the switched reference signal initially comprises the decreased signal.

By this, when there is no modulation superimposed on the envelope signal, the decreased signal which has a level below the envelope signal is used in the comparison. Thus, when the first modulation pulse is received, the demodulation behaves like a DC-coupled demodulation with dual time constant which is designed for demodulating ISO 14443B signals.

In case that a FeliCa preamble is received, the demodulation starts with the threshold of the decreased signal and slowly settles to a threshold value which is approximately in the middle of the modulation depth, regardless of the modulation index. Because of this it functions like an AC-coupled demodulation.

BRIEF DESCRIPTION OF THE DRAWINGS

The text below explains the proposed principle in detail using exemplary embodiments with reference to the drawings. Components and circuit elements that are functionally identical or have the identical effect bear identical reference numbers. In so far as circuit parts or components correspond to one another in function, a description of them will not be repeated in each of the following figures, wherein.

DETAILED DESCRIPTION

Figure 1:
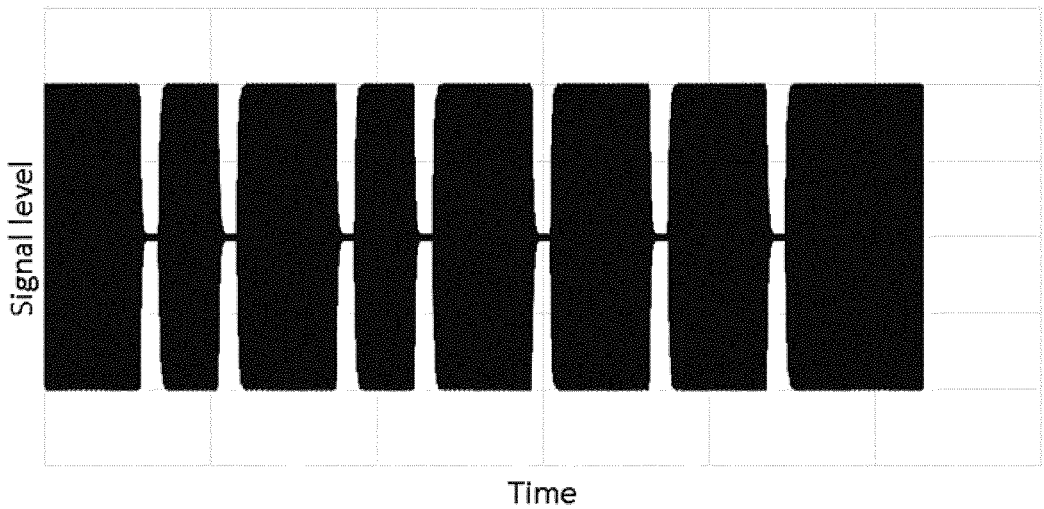
FIG. 1 shows an RF signal according to ISO 14443A (NFC-A) modulation.
Figure 2:
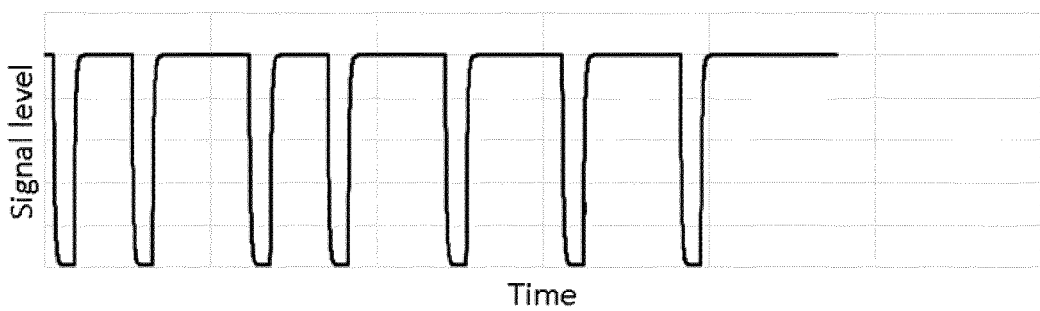
FIG. 2 shows an envelope signal corresponding to the modulated signal of FIG. 1.
Figure 3:
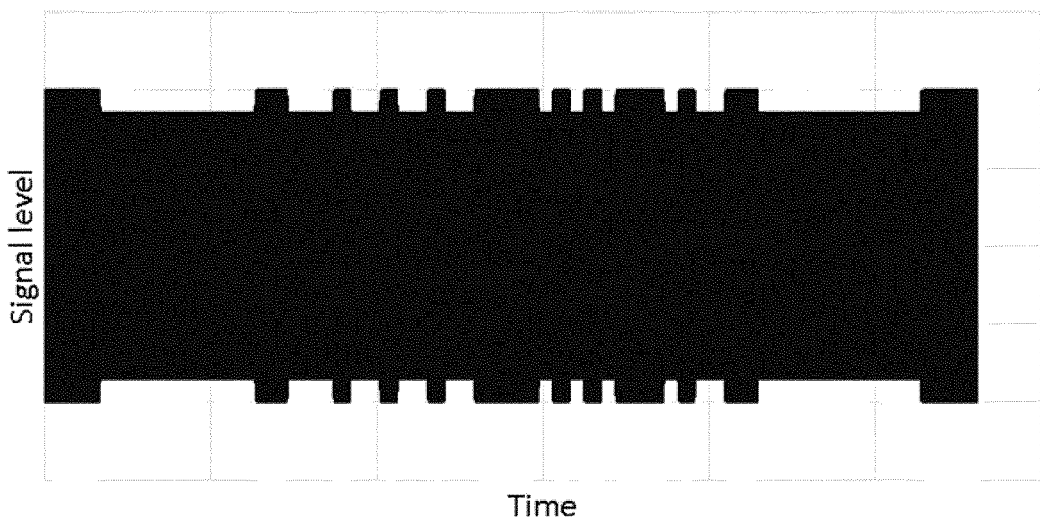
FIG. 3 shows an RF signal according to ISO 14443B (NFC-B) modulation.
Figure 4:
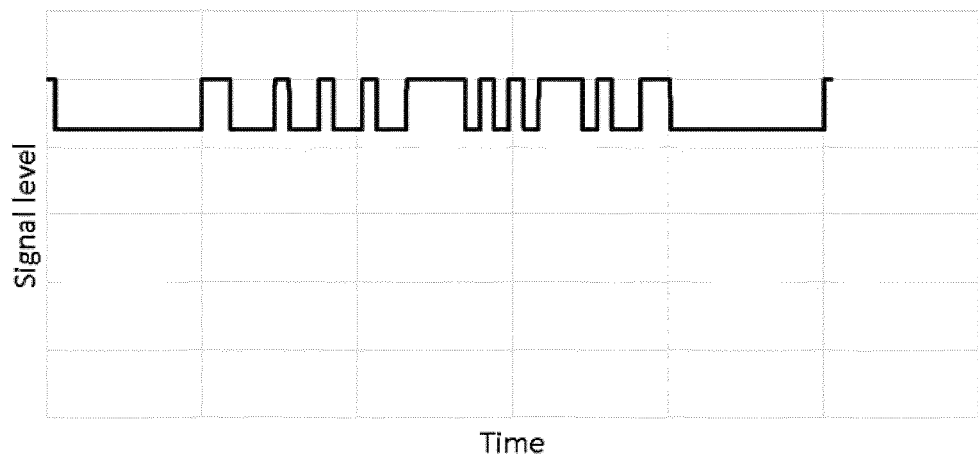
FIG. 4 shows an envelope signal corresponding to the modulated signal of FIG. 3.
Figure 5:
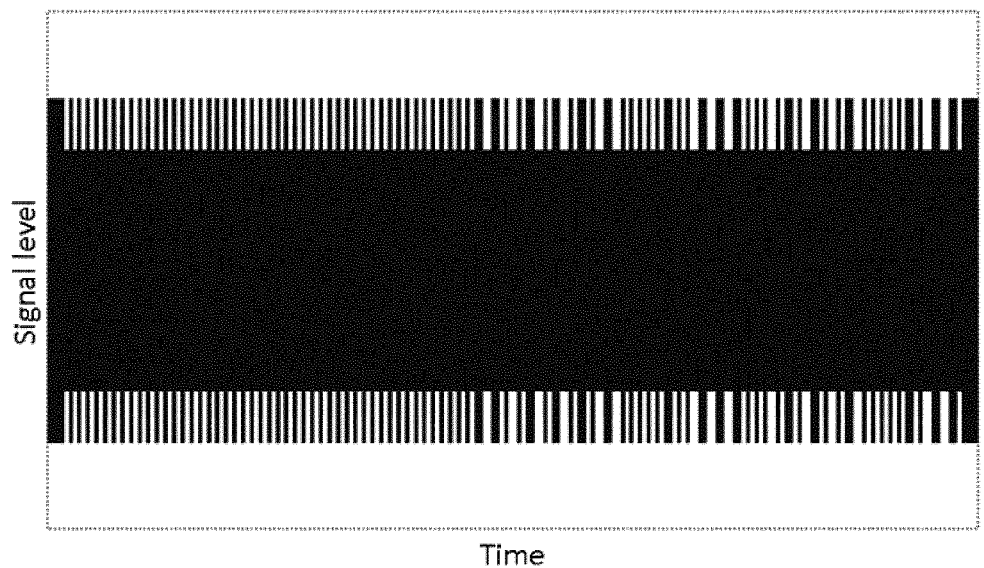
FIG. 5 shows an RF signal according to FeliCa (NFC-F) modulation.
Figure 6:
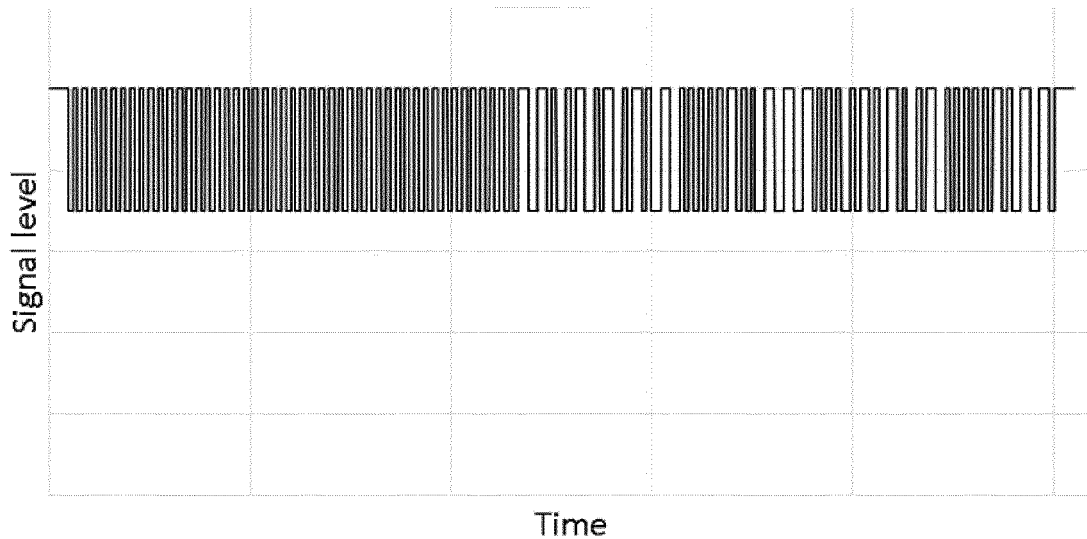
FIG. 6 shows an envelope signal corresponding to the modulated signal of FIG. 5.
Figure 7:
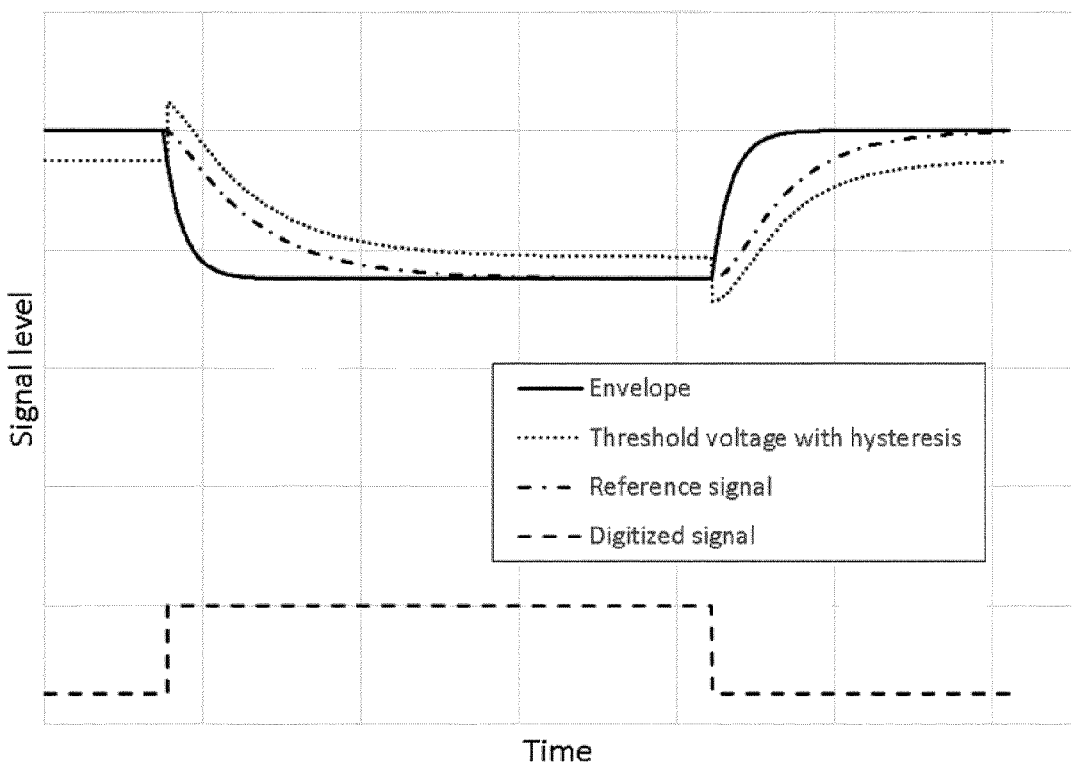
FIG. 7 shows signals of a prior art demodulator designed for ISO 14443B.
Figure 8:
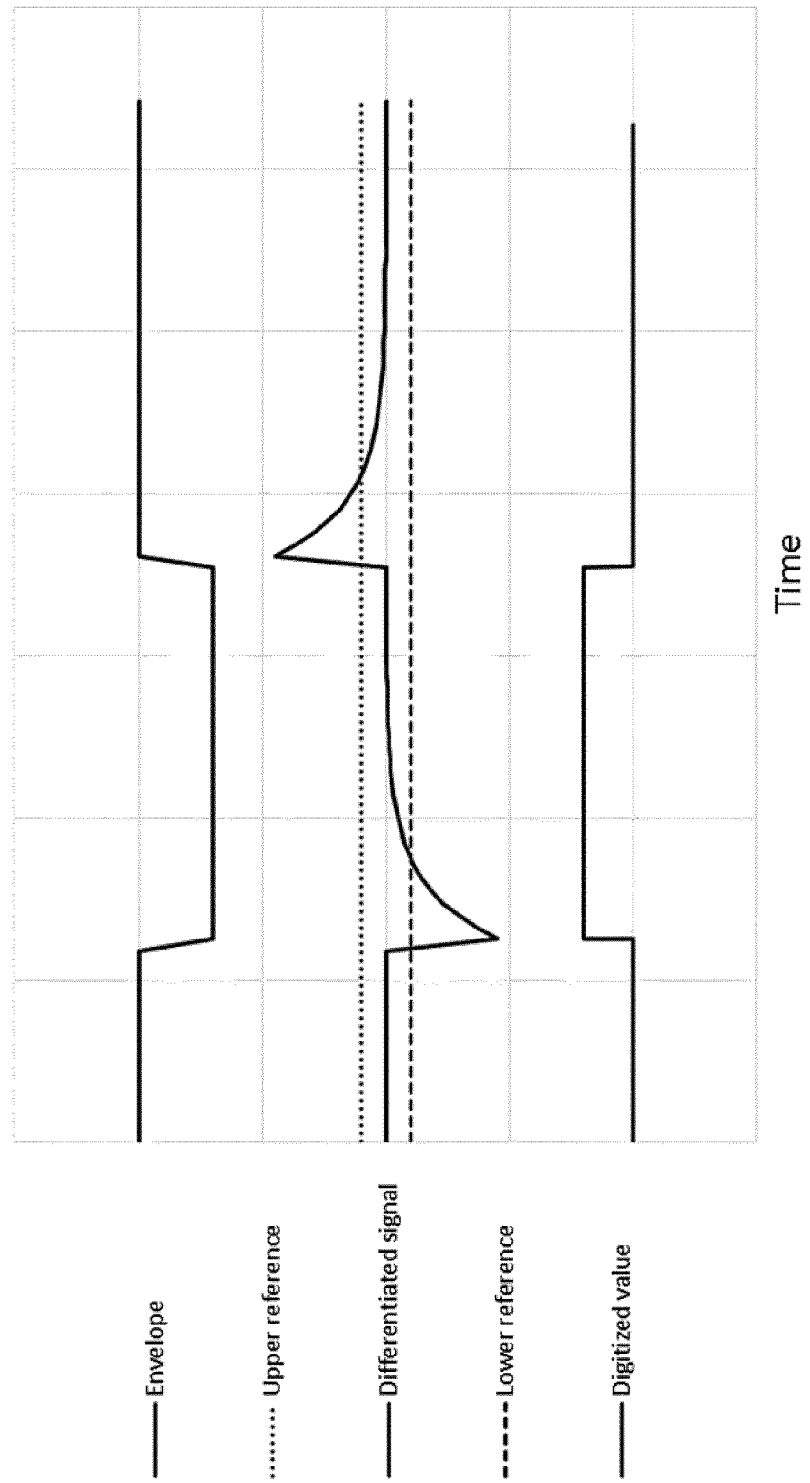
FIG. 8 shows signals of a prior art AC-coupled demodulator.
Figure 9:
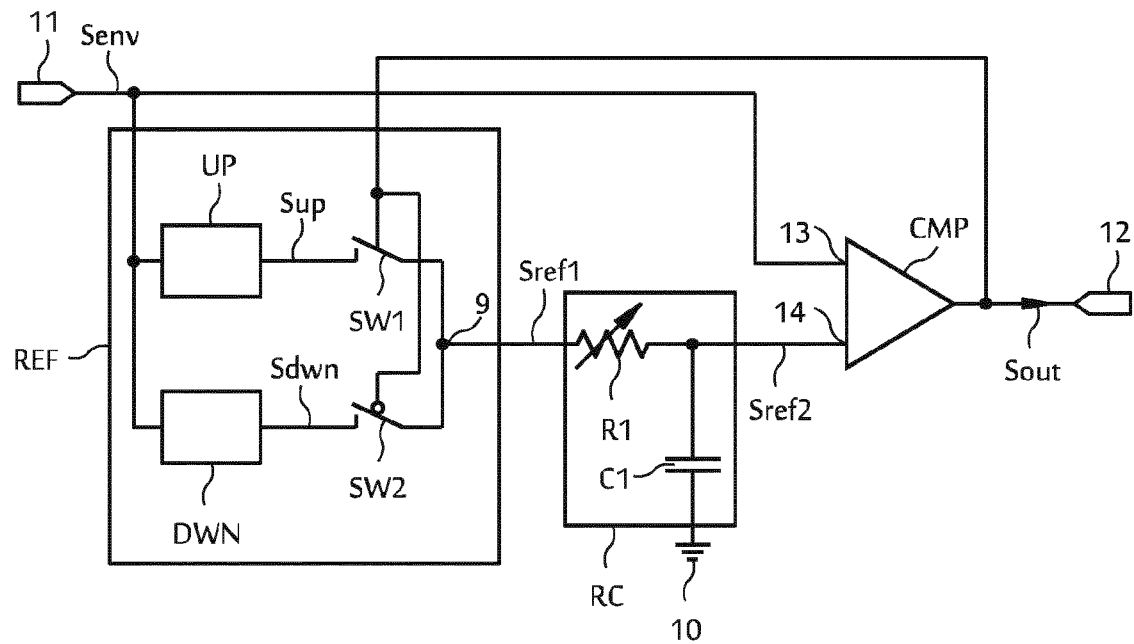
FIG. 9 shows a first exemplary embodiment of the proposed demodulator circuit.

FIG. 9 shows a first exemplary embodiment of the proposed demodulator circuit. The demodulator circuit comprises an input 11 for receiving an envelope signal Senv, a unit REF for providing a switched reference signal Sref1, a filter component RC, a comparator CMP and an output 12 for providing an output signal Sout. The unit REF is coupled to the input 11. The unit REF has an up-converter block UP, a down-converter block DWN, a first switch SW1, a second switch SW2 and an output 9. The filter component RC has a first variable resistor R1 and a capacitor C1. One terminal of the first variable capacitor R1 is coupled to the output of the unit REF. A second terminal of the first variable resistor R1 is connected to one terminal of the capacitor C1. The other terminal of the capacitor C1 is connected to a reference potential terminal 10. The comparator CMP has a first input 13 which is coupled to the input 11. The comparator CMP further has a second input 14 which is coupled to an output of the filter component RC, said output being represented by a connection point between the first variable resistor R1 and the capacitor C1. An output of the comparator CMP forms the output 12. The filter component RC realizes a low pass filter for the switched reference signal Sref1. At the output of the filter component RC a filtered switched reference signal Sref2 is provided. The output signal Sout is used to control first and second switches SW1, SW2 of the unit REF. Therein, the second switch SW2 is controlled by an inversion of the output signal Sout.

The up-converter block UP is connected on the one hand to the input 11 and on the other hand to the output 9 of the unit REF via the first switch SW1. The down-converter block DWN is coupled on the one side to the input 11 of the demodulator circuit and on the other side to the output 9 of the unit REF via the second switch SW2. The up converter block UP provides an increased signal Sup, whereas the down converter block DWN provides a decreased signal Sdwn.

The envelope signal Senv is provided to the input 11 of the demodulator circuit. The envelope signal Senv is passed directly to the first input of the comparator CMP. Furthermore, the envelope signal Senv is processed in the unit REF, i.e. the envelope signal Senv is amplified in the up-converter block UP and provided as the increased signal Sup and the envelope signal Senv is attenuated in the down-converter block DWN and provided as the decreased signal Sdwn. Depending on the status of the digital output signal Sout, either the first switch SW1 or the second switch SW2 is closed. Whenever the output signal Sout is at logic low, the decreased signal Sdwn representing the attenuated version of the envelope signal Senv is connected to the filter component RC. In the case that the output signal Sout is at logic high, the first switch SW1 is closed and the increased signal Sup representing the amplified version of the envelope signal Senv is connected to the filter component RC. Consequently, the switched reference signal Sref1 either comprises the increased signal Sup or the decreased signal Sdwn depending on the state of the output signal Sout.

The switched reference signal Sref1 is low pass filtered in the filter component RC and provided as the filtered switched reference signal Sref2 to the second input 14 of the comparator CMP.

The comparator CMP compares the envelope signal Senv to the filtered switched reference signal Sref2 and provides the output signal Sout as a result.

The proposed demodulator uses two additional signals, namely the increased signal Sup and the decreased signal Sdwn to create the reference, i.e. the filtered switched reference signal Sref2, to which the envelope signal Senv is compared for digitizing. The filter component RC holds the reference value. The switching between the increased and the decreased signal Sup and Sdwn is controlled by the state of the demodulating comparator CMP. Initially, before the start of any signaling, the decreased signal Sdwn is used for the switched reference signal Sref1. This simulates the operation of a typical ISO 14443B demodulator as in state of the art implementations. The demodulator is able to detect even the first change in amplitude. Once the comparator CMP detects a change in amplitude of the envelope signal Senv, which is caused by an AM modulation, the switched reference signal Sref1 is switched to the increased signal Sup.

In short, the described demodulator circuit is enabled to demodulate an ASK modulated analog envelope signal Senv into the digital output signal Sout which contains the digital data by comparing the envelope signal Senv to the filtered switched reference signal Sref2 which is generated from amplification of the envelope signal Senv or attenuation of the envelope signal Senv, wherein the decision which signal needs to be filtered is concluded by means of the output signal Sout.

Consequently, the described demodulator circuit realizes the functionality of a state of the art AC coupled demodulator and a prior art DC demodulator in one single component. Implementation is thereby simplified and less expensive.

Figure 10:
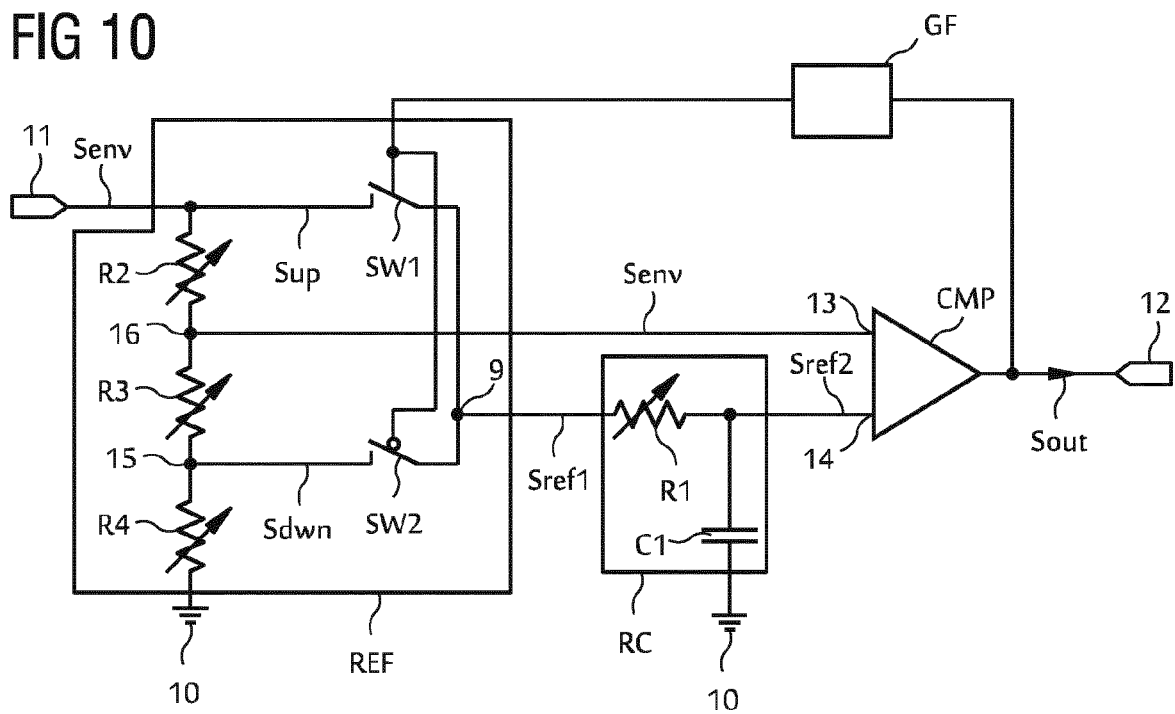
FIG. 10 shows a second exemplary embodiment of the proposed demodulator circuit.

FIG. 10 shows a second exemplary embodiment of the proposed demodulator circuit. The embodiment of FIG. 10 corresponds to the embodiment described in FIG. 9 except for the realization of the unit REF for providing the switch reference signal Sref1 and for an optional glitch filter GF. In FIG. 10, the unit REF comprises a resistive divider having a second, a third and a fourth resistor R2, R3, R4 which are connected in series. The second resistor R2 is connected to the input 11 of the demodulator circuit and to the third resistor R3 via a second connection point 16. The third resistor R3 is connected with its other terminal to the fourth resistor R4 via a first connection point 15. The fourth resistor R4 is also connected to the reference potential terminal 10. Each of the second, third and fourth resistors R2, R3, R4 has an adjustable resistance. The first switch SW1 is coupled between the input 11 and the output 9 of the unit REF. The second switch SW2 is connected between the first connection point 15 and the output 9 of the unit REF. The increased signal Sup is tapped at the input 11 of the demodulator circuit and is provided to the output 9 of the unit REF via the first switch SW1. The envelope signal Senv is tapped at the second connection point 16 and is provided directly to the first input 13 of the comparator CMP. The decreased signal is tapped at the first connection point 15 and is provided to the output 9 of the unit REF via the second switch SW2.

In this exemplary embodiment, the envelope signal Senv at the input 11 of the demodulator circuit is used as the increased signal Sup. By means of the resistive divider R2, R3, R4 the envelope signal Senv is provided with a slightly reduced level when compared to the increased signal Sup and is used as the envelope signal Senv at the first input 13 of the comparator CMP. Also, by means of the resistive divider R2, R3, R4 the decreased signal Sdwn is generated and provided to the output 9 of the unit REF in a switched fashion. Consequently, a level of the envelope signal Senv at the first input 13 of the comparator CMP lies between a level of the increased signal Sup and a level of the decreased signal Sdwn which are provided alternately to the second input 14 of the comparator CMP via the filter component RC.

The purpose of using variable resistors R2, R3, R4 is to be able to select and adjust the amplification and attenuation ratio of the envelope signal Senv.

The glitch filter GF is connected on the one hand to the output 12 of the comparator CMP and on the other hand to the first and second switches SW1, SW2. The glitch filter GF filters a possible glitch of the output signal Sout during its transition. Thereby, an undesired pulse of the output signal Sout which occurs before the output signal Sout settles to its intended value is avoided.

Operation of the first and the second exemplary embodiments is described in the following with reference to FIGS. 11 and 12.

Figure 11:
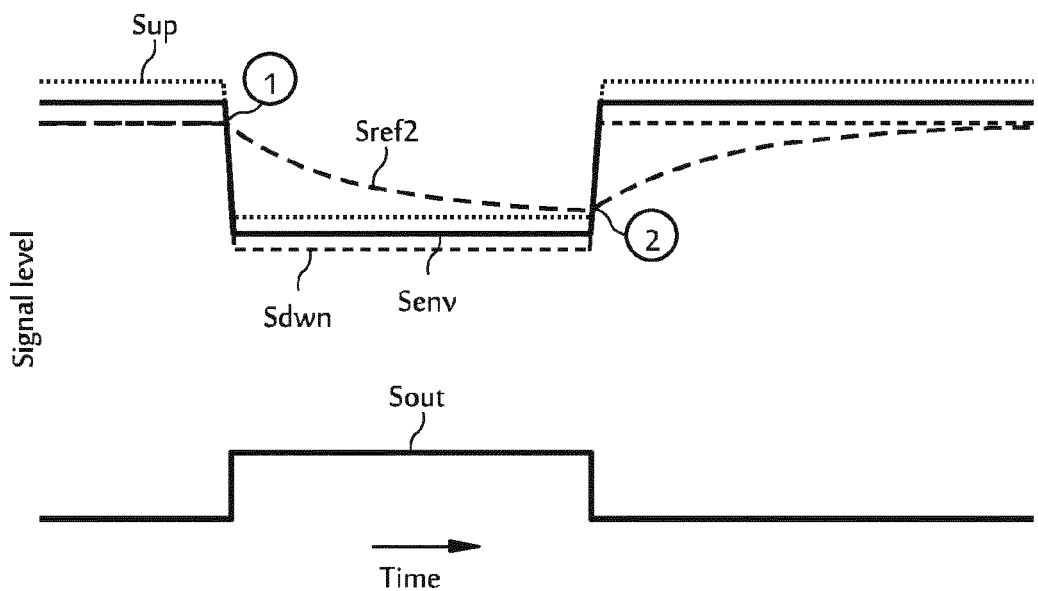
FIG. 11 shows signals corresponding to the embodiments of FIGS. 9 and 10.

FIG. 11 shows signal diagrams corresponding to the embodiments in FIGS. 9 and 10. Signal levels are depicted with reference to time. As explained above, the signal level can be represented by a voltage level. The upper part of FIG. 11 shows the envelope signal Senv, the increased signal Sup, the decreased signal Sdwn and the filtered switched reference signal Sref2. The lower part of FIG. 11 depicts the output signal Sout representing the digitized value determined from the envelope signal Senv.

In this example the envelope signal Senv is amplified by the factor 1.05 for providing the increased signal Sup. Furthermore, the envelope signal Senv is attenuated by the factor 0.95 to provide the decreased signal Sdwn. It can be seen that in the beginning the decreased signal Sdwn is used for the switched reference signal and is filtered into the filtered switched reference signal Sref2 which is used in the comparison. At first point 1, the envelope signal Senv crosses the filtered switched reference signal Sref2. Consequently, the output of the comparator switches and the level of the output signal Sout changes. The increased signal Sup is subsequently used for providing the filtered switched reference signal Sref2.

As soon as the envelope signal Senv once again crosses the level of the filtered switched reference signal Sref2 at point 2, the output of the comparator switches and the output signal Sout changes its level again which causes the decreased signal Sdwn being used in the generation of the filtered switched reference signal Sref2.

Additionally, once the envelope signal Senv crosses the reference Sref2, said reference Sref2 starts to discharge towards the level of the increased signal Sup. At the rising edge of the envelope signal Senv the reference Sref2 starts charging up to the level of the decreased signal Sdwn.

For initial pulses reaching the demodulator circuit, the circuit operates as a demodulator having fixed comparison thresholds scaled to the initial envelope signal Senv amplitude. This is the basic characteristic that is needed for demodulating ISO 14443B type signals, especially for detecting an SOF. With progression of the envelope signal Senv, the reference Sref2 is shifted to minimize the pulse width distortion of the output signal Sout which is typical for demodulation of FeliCa signals.

Consequently, the usage of the filtered switched reference signal Sref2 in the comparison with the envelope signal Senv solves the problem of demodulating different types of signaling, in particular recognizing an SOF, according to existing ISO and NFC standards within one single demodulator circuit.

The selection of the factor by which the increased signal is higher than the envelope signal Senv and by which the decreased signal Sdwn is lower than the envelope signal Senv depends on the minimum AM modulation which the demodulator circuit needs to detect. In the described embodiments the factor 1.05 is used in an exemplary way, meaning that the demodulator should trigger on an amplitude change of the envelope signal Senv which is higher than 5% corresponding to a modulation index which is higher than 2.5%. The described factor or ratio can be adapted to a required minimum modulation level which is higher or lower. The adaptation can be accomplished by adjusting the amplification and attenuation ratios used in the amplifier or attenuator of the first exemplary embodiment or by adjusting the resistance values of the variable resistors in the second exemplary embodiment.

The time constant realized by the filter component RC is selected as a function of the timing of the signals to be demodulated. In case of a FeliCa signal at the input the time constant is chosen to be longer by a few times than the duration of a bit. Modification of the time constant is accomplished by adjusting the resistance value of the variable resistor R1.

Figure 12:
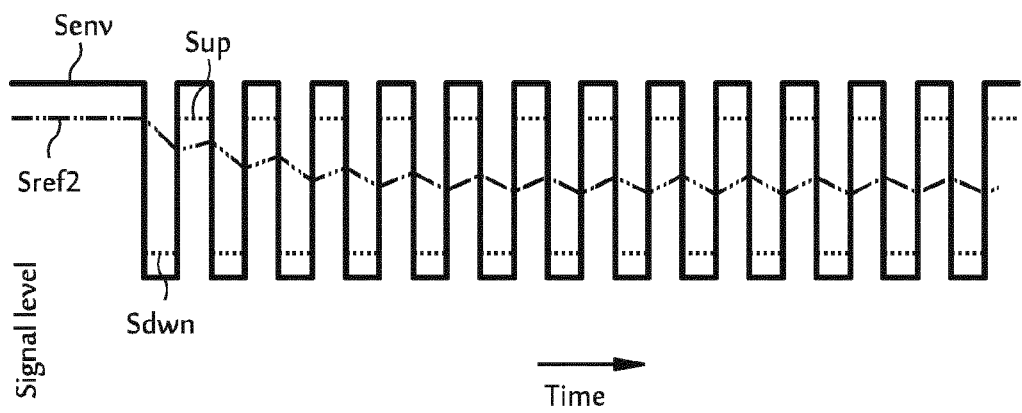
FIG. 12 shows signals corresponding to the embodiments of FIGS. 9 and 10.

FIG. 12 shows signal diagrams corresponding to the embodiments of FIGS. 9 and 10. This figure depicts the behavior of the proposed demodulator circuit in the presence of a FeliCa SOF with its typical unmodulated sub-carrier clock pules.

As explained above, initially the decreased signal Sdwn is used for provision of the filtered switched reference signal Sref2. In this example, the decreased signal Sdwn corresponds to the envelope signal Senv multiplied by the factor 0.95. The level of the filtered switched reference signal Sref2 which is used in the comparison gradually changes from its initial value to a level that corresponds to a midpoint between the modulated and the non-modulated envelope signal Senv levels, i.e. to a midpoint between the levels of the increased and the decreased signal Sup, Sdwn. The level of the filtered switched reference signal Sref2 settles at 50% of the modulation depth. Therefore, the output signal has a duty cycle or ratio of 50% resulting in an output signal which has very low or even no PW distortion. This is important when demodulating FeliCa signals.

REFERENCE LIST

1, 2 point in time
10 reference potential terminal
11, 13, 14 input
9, 12 output
15, 16 connection point
REF unit RC filter component
CMP comparator
UP, DWN conversion block
R1, R2, R3, R4 resistor
C1 capacitor
SW1, SW2 switch
Senv, Sup, Sdwn signal
Sref1, Sref2, Sout signal
GF glitch filter

The invention claimed is:

1. A demodulator circuit, comprising:
an input configured to receive an envelope signal,
a reference generator configured to generate a switched reference signal as a function of the envelope signal and as a function of an output signal of the demodulator circuit,
a filter circuit configured to filter the switched reference signal and generate a filtered switched reference signal, and
a comparator having a first input configured to receive the envelope signal and a second input configured to receive the filtered output signal, said comparator operable to output a demodulated output signal as a function of a difference between the envelope signal and the filtered switched reference signal,
wherein the reference generator comprises:
an up-converter circuit configured to provide an increased signal in response to the envelope signal;
a first switch actuated in response to the output signal to provide the increased signal to change the switched reference signal;
a down-converter circuit configured to provide a decreased signal in response to the envelope signal; and
a second switch actuated in response to an inversion of the output signal to provide the decreased signal to change the switched reference signal.

2. The demodulator circuit according to claim 1, wherein:
the up-converter circuit comprises a circuit configured to amplify the envelope signal to generate the increased signal; and
the down-converter circuit comprises a circuit configured to attenuate the envelope signal to generate the decreased signal.

3. The demodulator circuit according to claim 2,
wherein the circuit of the up-converter circuit is an amplifier with an adjustable amplification ratio, and
wherein the circuit of the down-converter circuit is an attenuator with an adjustable attenuation ratio.

4. The demodulator circuit according to claim 1,
wherein a level of the increased signal is higher than a level of the envelope signal by a first adjustable ratio, and
wherein a level of the decreased signal is lower than the level of the envelope signal by a second adjustable ratio.

5. The demodulator circuit according to claim 1, wherein the envelope signal is a rectified Amplitude Shift Keying (ASK) modulated signal.

6. The demodulator circuit according to claim 1, wherein the output signal is a digital baseband signal.

7. The demodulator circuit according to claim 1, wherein the filter circuit comprises a low-pass filter having a variable resistor and a capacitor, and wherein a connection node between the variable resistor and the capacitor provides the filtered switched reference signal.

8. The demodulator circuit according to claim 1, wherein the comparator has a built-in hysteresis.

9. A demodulator circuit, comprising:
an input configured to receive an envelope signal,
a reference generator configured to generate a switched reference signal as a function of the envelope signal and as a function of an output signal of the demodulator circuit,
a filter circuit configured to filter the switched reference signal and generate a filtered switched reference signal, and
a comparator having a first input configured to receive the envelope signal and a second input configured to receive the filtered output signal, said comparator operable to output a demodulated output signal as a function of a difference between the envelope signal and the filtered switched reference signal;
wherein the reference generator comprises:
a resistive divider having a first tap node outputting an increased signal in response to the envelope signal and a second tap node outputting a decreased signal in response to the envelope signal;
a first switch actuated in response to the output signal to provide the increased signal to change the switched reference signal; and
a second switch actuated in response to an inversion of the output signal to provide the decreased signal to change the switched reference signal.

10. The demodulator circuit according to claim 9, wherein the resistive divider comprises:
a first resistor coupled between the first tap node and a third tap node coupled to the first input of the comparator;
a second resistor coupled between the third tap node and the second tap node; and
a third resistor coupled between the second tap node and a reference node.

11. The demodulator circuit according to claim 10, wherein at least one of the first, second and third resistors is a variable resistor.

12. The demodulator circuit according to claim 9,
wherein a level of the increased signal is higher than a level of the envelope signal by a first adjustable ratio, and
wherein a level of the decreased signal is lower than the level of the envelope signal by a second adjustable ratio.

13. The demodulator circuit according to claim 9, wherein the envelope signal is a rectified Amplitude Shift Keying (ASK) modulated signal.

14. The demodulator circuit according to claim 9, wherein the output signal is a digital baseband signal.

15. The demodulator circuit according to claim 9, wherein the filter circuit comprises a low-pass filter having a variable resistor and a capacitor, and wherein a connection node between the variable resistor and the capacitor provides the filtered switched reference signal.

16. The demodulator circuit according to claim 9, wherein the comparator has a built-in hysteresis.

17. A method for demodulation, comprising:
generating a switched reference signal as a function of an envelope signal and as a function of a demodulator output signal, wherein generating comprises:
producing an increased signal by up-converting the envelope signal;
producing a decreased signal by down-converting the envelope signal;

switching to select the increased signal as the switched reference signal in response to a first logic state of the demodulator output signal; and switching to select the decreased signal as the switched reference signal in response to a second logic state, opposite the first logic state, of the demodulator output signal;

filtering the switched reference signal to provide a filtered switched reference signal; and comparing the filtered switched reference signal with the envelope signal to output the demodulator output signal.

18. The method of claim 17, wherein up-converting the envelope signal comprises increasing a level of the envelope signal to provide the increased signal; and wherein down-converting the envelope signal comprises decreasing a level of the envelope signal to provide the decreased signal.

19. The method of claim 18, wherein increasing the level comprises amplifying the envelope signal; and wherein decreasing the level comprises attenuating the envelope signal.

20. The method of claim 17, wherein the envelope signal is a rectified Amplitude Shift Keying (ASK) modulated signal.

21. The method of claim 17, wherein the output signal is a digital baseband signal.

22. A method for demodulation, comprising:

generating a switched reference signal as a function of an envelope signal and as a function of a demodulator output signal, wherein generating comprises:
  producing an increased signal from the envelope signal;
  producing a decreased signal from the envelope signal;
  changing the switched reference signal using the increased signal in response to the demodulator output signal; and
  changing the switched reference signal using the decreased signal in response to an inversion of the demodulator output signal;

filtering the switched reference signal to provide a filtered switched reference signal; and comparing the filtered switched reference signal with the envelope signal to output the demodulator output signal;

wherein producing the increased signal from the envelope signal comprises first dividing the envelope signal with a first ratio to provide the increased signal; and wherein producing the decreased signal from the envelope signal comprises second dividing the envelope signal with a second ratio to provide the decreased signal.

23. The method of claim 22, wherein the envelope signal is a rectified Amplitude Shift Keying (ASK) modulated signal.

24. The method of claim 22, wherein the output signal is a digital baseband signal.

* * * * *